United States Patent
Purushothaman et al.

(10) Patent No.: US 11,288,153 B2
(45) Date of Patent: Mar. 29, 2022

(54) SELF-HEALING COMPUTING DEVICE

(71) Applicant: Bank of America Corporation, Charlotte, NC (US)

(72) Inventors: Sasidhar Purushothaman, Hyderabad (IN); Ankush Sethi, New Delhi (IN); Gowthaman Trichy Karuppusamy, Chennai (IN); Shikha Dixit, Ahmedabad (IN)

(73) Assignee: Bank of America Corporation, Charlotte, NC (US)

( * ) Notice: Subject to any disclaimer, the term of this patent is extended or adjusted under 35 U.S.C. 154(b) by 20 days.

(21) Appl. No.: 16/905,592

(22) Filed: Jun. 18, 2020

(65) Prior Publication Data

US 2021/0397527 A1    Dec. 23, 2021

(51) Int. Cl.
    *G06F 11/00*    (2006.01)
    *G06F 11/263*   (2006.01)
    *G06F 11/07*    (2006.01)
    *G06F 11/22*    (2006.01)
    *G06F 9/445*    (2018.01)

(52) U.S. Cl.
    CPC ...... *G06F 11/2635* (2013.01); *G06F 9/44505* (2013.01); *G06F 11/0793* (2013.01); *G06F 11/2247* (2013.01); *G06F 11/2268* (2013.01)

(58) Field of Classification Search
    CPC .................. G06F 11/2635; G06F 11/0793
    See application file for complete search history.

(56) References Cited

U.S. PATENT DOCUMENTS

| | | |
|---|---|---|
| 5,991,529 A | 11/1999 | Cox et al. |
| 6,651,240 B1 | 11/2003 | Yamamoto et al. |
| 6,876,314 B1 | 4/2005 | Lin |
| 7,062,755 B2 | 6/2006 | Partamian et al. |
| 7,219,279 B2 | 5/2007 | Chandra et al. |
| 7,313,564 B2 | 12/2007 | Melamed |
| 7,681,180 B2 | 3/2010 | de Halleux et al. |
| 7,840,944 B2 | 11/2010 | Brunswig et al. |
| 7,913,229 B2 | 3/2011 | Squires et al. |
| 8,078,924 B2 | 12/2011 | Jibbe |
| 8,087,001 B2 | 12/2011 | Hoyek et al. |
| 8,239,831 B2 | 8/2012 | Brennan et al. |
| 8,245,194 B2 | 8/2012 | Atkin et al. |
| 8,549,483 B1 | 10/2013 | Bridges, Sr. et al. |
| 8,881,109 B1 | 11/2014 | Bridges, Sr. et al. |
| 8,938,647 B2 | 1/2015 | Gaillard et al. |
| 9,268,669 B2 | 2/2016 | Salloum et al. |
| 9,632,754 B2 | 4/2017 | Gyure et al. |
| 2002/0188890 A1 | 12/2002 | Shupps et al. |

(Continued)

*Primary Examiner* — Philip Guyton (57) ABSTRACT

A device configured to periodically monitor operational activity of hardware components within a computing system infrastructure. The device is further configured to detect an issue that is associated with a hardware component, to identify commands that are sent to the hardware component to resolve the first issue, and to identify a test environment configuration for simulating the effect of sending the commands to the hardware component on the computing system infrastructure. The device is further configured to generate a solution script based on the identified commands and a testing script based on the identified test environment configuration, and to store an association between the first issue, the solution script, and the testing script in a script map.

20 Claims, 3 Drawing Sheets

(56) References Cited

U.S. PATENT DOCUMENTS

| | | | |
|---|---|---|---|
| 2003/0041288 A1 | 2/2003 | Kolawa et al. | |
| 2003/0046613 A1 | 3/2003 | Farchi et al. | |
| 2004/0078684 A1 | 4/2004 | Friedman et al. | |
| 2005/0229043 A1 | 10/2005 | Nasuti et al. | |
| 2006/0010429 A1 | 1/2006 | Ihara | |
| 2006/0161508 A1 | 7/2006 | Duffle et al. | |
| 2006/0230320 A1 | 10/2006 | Salvador et al. | |
| 2006/0248405 A1 | 11/2006 | Ponczak et al. | |
| 2008/0086348 A1 | 4/2008 | Rao et al. | |
| 2008/0115116 A1 | 5/2008 | Francis et al. | |
| 2008/0270841 A1 | 10/2008 | Quilter | |
| 2009/0172647 A1 | 7/2009 | Telang | |
| 2009/0271170 A1* | 10/2009 | De Barros | G06F 11/3433 703/21 |
| 2010/0146489 A1 | 6/2010 | Ortiz | |
| 2011/0123973 A1 | 5/2011 | Singh | |
| 2011/0131451 A1 | 6/2011 | Bosch | |
| 2011/0289488 A1 | 11/2011 | Ghosh | |
| 2011/0307860 A1 | 12/2011 | Park et al. | |
| 2012/0084754 A1 | 4/2012 | Ziegler et al. | |
| 2013/0042222 A1 | 2/2013 | Maddela | |
| 2013/0055195 A1 | 2/2013 | Weigert | |
| 2013/0326471 A1 | 12/2013 | Nucci et al. | |
| 2014/0013298 A1 | 1/2014 | Gyure et al. | |
| 2014/0282419 A1 | 9/2014 | Yoshida et al. | |
| 2015/0113331 A1 | 4/2015 | Bhattacharya et al. | |
| 2015/0169433 A1 | 6/2015 | Bryl et al. | |
| 2015/0309813 A1 | 10/2015 | Patel | |
| 2015/0324274 A1 | 11/2015 | Raghavan et al. | |
| 2017/0060728 A1 | 3/2017 | Younger et al. | |
| 2017/0083400 A1* | 3/2017 | McEwen | G06F 11/2257 |
| 2017/0337116 A1 | 11/2017 | Negara et al. | |
| 2018/0217921 A1 | 8/2018 | Palyekar et al. | |

* cited by examiner

SELF-HEALING COMPUTING DEVICE

TECHNICAL FIELD

The present disclosure relates generally to computing devices, and more specifically to self-healing computing devices.

BACKGROUND

Existing computer systems are constantly changing to keep up with a consumer's needs. Hardware and software components may be continuously added, removed, or modified as the needs of a computer system evolves. The continuous evolution of a computer system poses a technical challenge because new errors and issues may arise as changes are made to the computer system. Identifying and resolving these types of issues in large computer systems is a difficult and time-consuming task which results in a significant amount of downtime for the computer system and reduces the throughput of the computing system while the system is being repaired. Issues within a computer system may be unique to the configuration of components within the system infrastructure and they may arise due to any number of variables. This means that each issue requires a sufficient amount of time to troubleshoot and resolve. This downtime also has a detrimental effect on the performance and throughput of other computer systems that rely on data from the computer system.

SUMMARY

The system disclosed in the present application provides a technical solution to the technical problems discussed above by monitoring for issues within a computer system and autonomously resolving these issues. For example, a computer system may experience error codes, data errors, data loss, slow response times, an increase processor usage, a decrease in available memory, a decrease in available bandwidth, a decrease in data throughput, or any other type of decrease of performance. The disclosed system provides the ability to detect and resolve any issues that affect the performance of the computer system. The disclosed system provides several practical applications and technical advantages which include a process for using supervised learning to identify solutions for resolving issues within a computer system and generating scripts that can be used to resolve these issues in the future. For example, this process allows the computer system to learn which commands and operations are typically used to resolve an issue within the computer system and how to apply these commands to resolve future issues within the computer system. After an initial learning phase, this process enables a computer system to then autonomously detect and resolve future issues within the computer system. In existing computer systems, the source for issues such as a decrease in performance may not be easily detectable. This means that the computer system will experience a decrease performance, for example a decrease in throughput, until the source of the issue has been determined. Once the source of an issue has identified, then the computer system will need to be at least partially shut down to allow a network operator to make repairs to the computer system. This shutdown results in a downtime where the computer system may operate in a limited capacity.

In contrast, the process disclosed in the present application allows the computer system to quickly detect an issue within the computer system, to identify a source of the issue, and to autonomously implement a solution to resolve the issue. By reducing the amount of time required to detect an issue and its source, the computer system is able to reduce amount of time that the computer system operates with degraded performance. In addition, by autonomously identifying and implementing a solution, the computer system is able to reduce the amount of time it takes to resolve an issue within the computer system which reduces the amount of downtime that the computer system will experience. By reducing the amount of downtime that the computer system experiences, this means that the computer system is able to spend more time operating at its full capacity which means that the computer system can maintain a higher throughput and improve the utilization of the computer system. Furthermore, the computer system is configured to test and vet solutions using test environment and testing scripts before they are deployed within the computer system. This process reduces the likelihood of introducing new errors and issues into the system infrastructure after deploying a solution to resolve an issue.

In one embodiment, the system comprises a system healing device that is configured to monitor the health and operational activity of a computing system infrastructure as the system infrastructure changes over time. This process allows the system healing device to detect and resolve issues as they arise within the system infrastructure. This process reduces the downtime due to diagnosing and resolving issues within the system infrastructure. Initially, the system healing device is configured to operate in a learning phase to identify patterns and instructions that are used to resolve issues within the system infrastructure. In one embodiment, the system healing device is configured to use Application Programming Interfaces (APIs) to communicate with system components (e.g. software and hardware components) to determine operating characteristics of the system components. The system healing device is further configured to generate solution scripts and testing scripts using supervised learning based on monitoring the actions that are taken by a network operator to resolve issues within the system infrastructure. The solution scripts comprise instructions for resolving an issue. The testing scripts comprise instructions for testing a solution script within a test environment before deploying the solution script within the system infrastructure.

After the learning phase and establishing a repository of solution scripts and testing scripts, the system healing device is configured to operate in an autonomous self-healing phase to begin detecting and resolving issues within the system infrastructure. The system healing device is further configured to autonomously detect issues within the system infrastructure and to identify solution scripts and testing scripts for resolving the detected issue. The system healing device is configured to execute the testing script to generate a test environment for determining which of the identified solution scripts best resolves the detected issue. After identifying a solution script that resolves the detected issue, the system healing device is configured to deploy the selected solution script within the system infrastructure by executing the instructions or commands provided by the solution script. This process allows the system healing device to deploy solutions that have been tested and vetted before they are deploy within the system infrastructure. This process reduces the likelihood of introducing new errors and issues into the system infrastructure after deploying a solution to resolve an issue.

Certain embodiments of the present disclosure may include some, all, or none of these advantages. These advantages and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

System Overview

Figure 1:
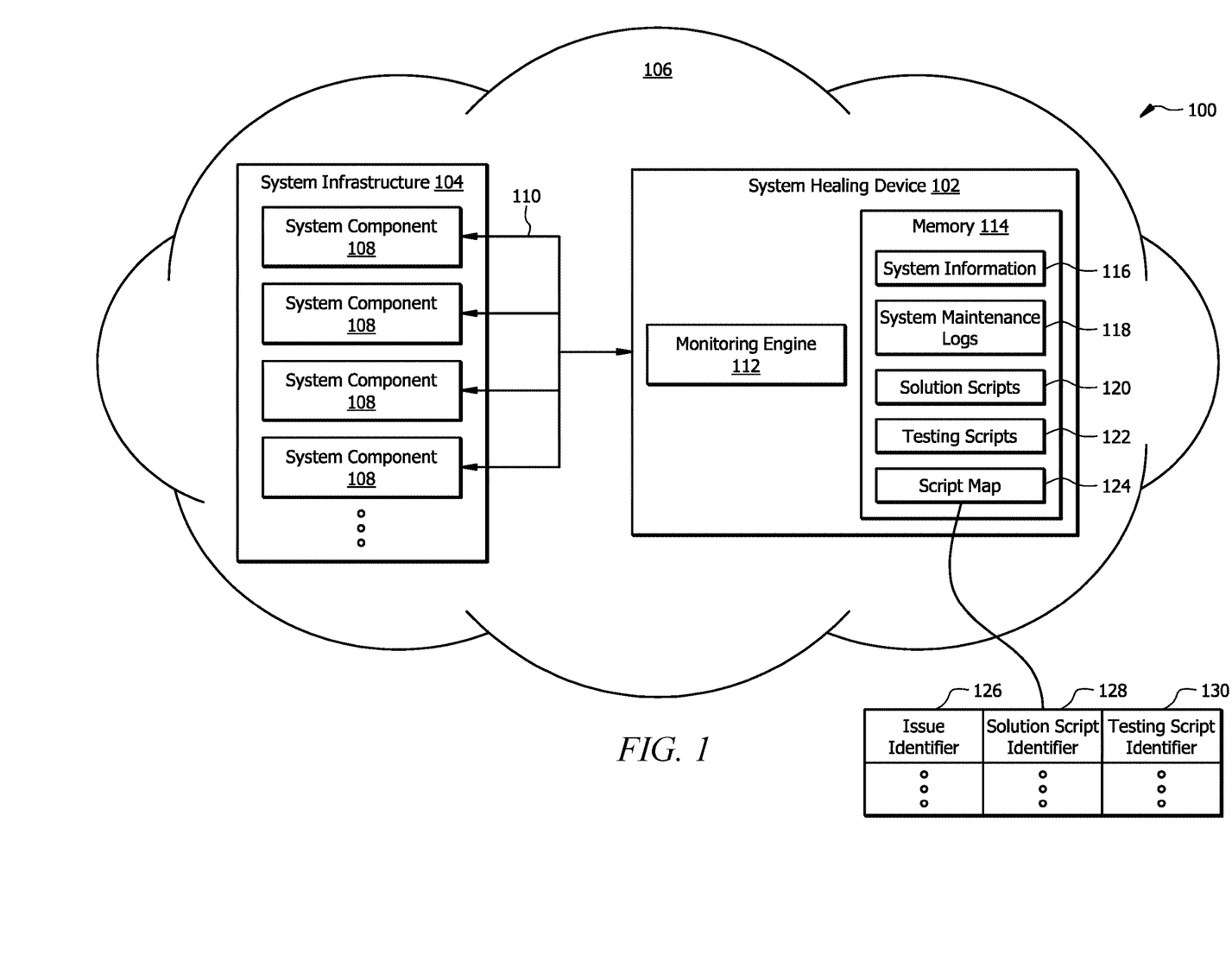
FIG. 1 is a schematic diagram of a self-healing computing system.

FIG. 1 is a schematic diagram of a self-healing computing system 100. In one embodiment, the system 100 comprises a system healing device 102 that is in signal communication with a computing system infrastructure 104 within a network 106.

The network 106 may be any suitable type of wireless and/or wired network including, but not limited to, all or a portion of the Internet, an Intranet, a private network, a public network, a peer-to-peer network, the public switched telephone network, a cellular network, a local area network (LAN), a metropolitan area network (MAN), a wide area network (WAN), and a satellite network. The network 106 may be configured to support any suitable type of communication protocol as would be appreciated by one of ordinary skill in the art.

In one embodiment, the system healing device 102 that is configured to monitor the health and operational activity of the computing system infrastructure 104 as the system infrastructure changes over time. Initially, the system healing device 102 is configured to operate in a learning phase to identify patterns and instructions that are used to resolve issues within the system infrastructure 104. The system healing device 102 is further configured to generate solution scripts 120 and testing scripts 122 using supervised learning based on monitoring the actions that are taken by a network operator to resolve issues within the system infrastructure. The solution scripts comprise instructions for resolving an issue. The testing scripts comprise instructions for testing a solution script within a test environment before deploying the solution script within the system infrastructure.

After the learning phase and establishing a repository of solution scripts 120 and testing scripts 122, the system healing device 102 is configured to operate in an autonomous self-healing phase to begin detecting and resolving issues within the system infrastructure 104. The system healing device 102 is further configured to autonomously detect issues within the system infrastructure and to identify solution scripts 120 and testing scripts 122 for resolving the detected issue. The system healing device 102 is configured to execute the testing script 122 to generate a test environment for determining which of the identified solution scripts 120 best resolves the detected issue. After identifying a solution script 120 that resolves the detected issue, the system healing device 102 is configured to deploy the selected solution script 120 within the system infrastructure 104 by executing the instructions or commands provided by the solution script 120.

Computing System Infrastructure

The computing system infrastructure 104 comprises a plurality of system components 108. System components 108 are hardware and software components that are configured to form a computing system. Examples of system components 108 include, but are not limited to, processors, databases, memories, database management tools, servers, clients, network devices, operating systems, applications, virtual machines, cloud services, development tools, or any other suitable type of hardware or software component.

System Healing Device

The system healing device 102 is generally configured to monitor the health of the system infrastructure 104 and to autonomously resolve issues within the system infrastructure 104. The system healing device 102 is in signal communication with the system components 108 using Application Programming Interfaces (APIs) 110 which allow the system healing device 102 to monitor the operational activity and health of the system components 108. For example, the system healing device 102 may use APIs to determine response times, processer utilization, memory utilization, bandwidth utilization, data throughput, available memory disk space, error codes, job failures, batch errors, or any other suitable type of information about a system component 108.

The system healing device 102 comprises a monitoring engine 112 and a memory 114. The system healing device 102 may be configured as shown or in any other suitable configuration. Additional information about the hardware configuration of the system healing device 102 is described in FIG. 3.

The memory 114 is configured to store system information 116, system maintenance logs 118, solution scripts 120, testing scripts 122, script maps 124, and/or any other suitable type of data. The system information 116 comprises information about the state or health of system components 108 and the overall system infrastructure 104. For example, the system information 116 may comprise information about response times, processer utilization, memory utilization, bandwidth utilization, data throughput, available memory disk space, error codes, job failures, batch errors, or any other suitable type of information about a system component 108 or the overall system infrastructure 104. The system maintenance logs 118 comprise a sequence of commands and instructions that are used to resolve the issue. The solution scripts 120 comprise executable commands for performing operations on one or more system components 108. The testing scripts 122 comprise executable commands for configuring a test environment to simulate one or more solution scripts 120. The script map 124 is configured to associate an issue with a solution script 120 and a testing script 122 that are associated with resolving the issue.

Monitoring Engine

The monitoring engine 112 is generally configured to monitor the health and the operational activity of the system infrastructure 104. Over time, the system components 108 within the system infrastructure 104 may be modified. For example, a network operator may add new system components 108 to the system infrastructure 104, to remove system components 108 from the system infrastructure 104, or to modify a configuration for a system component 108. The monitoring engine 112 is configured to monitor the health and operational activity of the system infrastructure 104 as the system infrastructure changes. This process allows the system healing device 102 to detect and to resolve issues as they arise within the system infrastructure 104. This process reduces the downtime due to diagnosing and resolving issues within the system infrastructure 104. In one embodiment, the monitoring engine 112 is configured to use APIs to communicate with system components 108 to determine operating characteristics of the system components 108. In some embodiments, the monitoring engine 112 may be configured to periodically capture system information 116 that describes the state or health of system components 108 and the overall system infrastructure 104. The monitoring engine 112 may also be configured to collect system information 116 that comprises data traffic that can be used in a testing environment for resolving issues within the system infrastructure 104.

Initially, the monitoring engine 112 operates in a learning phase to identify patterns and instructions that are used to resolve issues within the system infrastructure 104. The monitoring engine 112 is further configured to generate solution scripts 120 and testing scripts 122 using supervised learning based on monitoring the actions that are taken by a network operator to resolve issues within the system infrastructure 104. The solution scripts 120 comprise instructions for resolving an issue. The testing scripts 122 comprise instructions for testing a solution script 120 within a test environment before deploying the solution script 120 within the system infrastructure 104.

After the learning phase and establishing a repository of solution scripts 120 and testing scripts 122, the monitoring engine 112 is configured to operate in an autonomous self-healing phase. In the self-healing phase, the monitoring engine 112 begins autonomously detecting and resolving issues within the system infrastructure 104. The monitoring engine 112 is further configured to autonomously detect issues within the system infrastructure 104 and to identify solution scripts 120 and testing scripts 122 for resolving the detected issue. The monitoring engine 112 is configured to execute the testing script 122 to generate a test environment for determining which of the identified solution scripts 120 best resolves the detected issue. After identifying a solution script 120 that resolves the detected issue, the monitoring engine 112 is configured to deploy the selected solution script 120 within the system infrastructure 104 by executing the instructions or commands provided by the solution script 120. An example of the monitoring engine 112 in operation is described in FIG. 2.

Self-Healing Process

Figure 2:
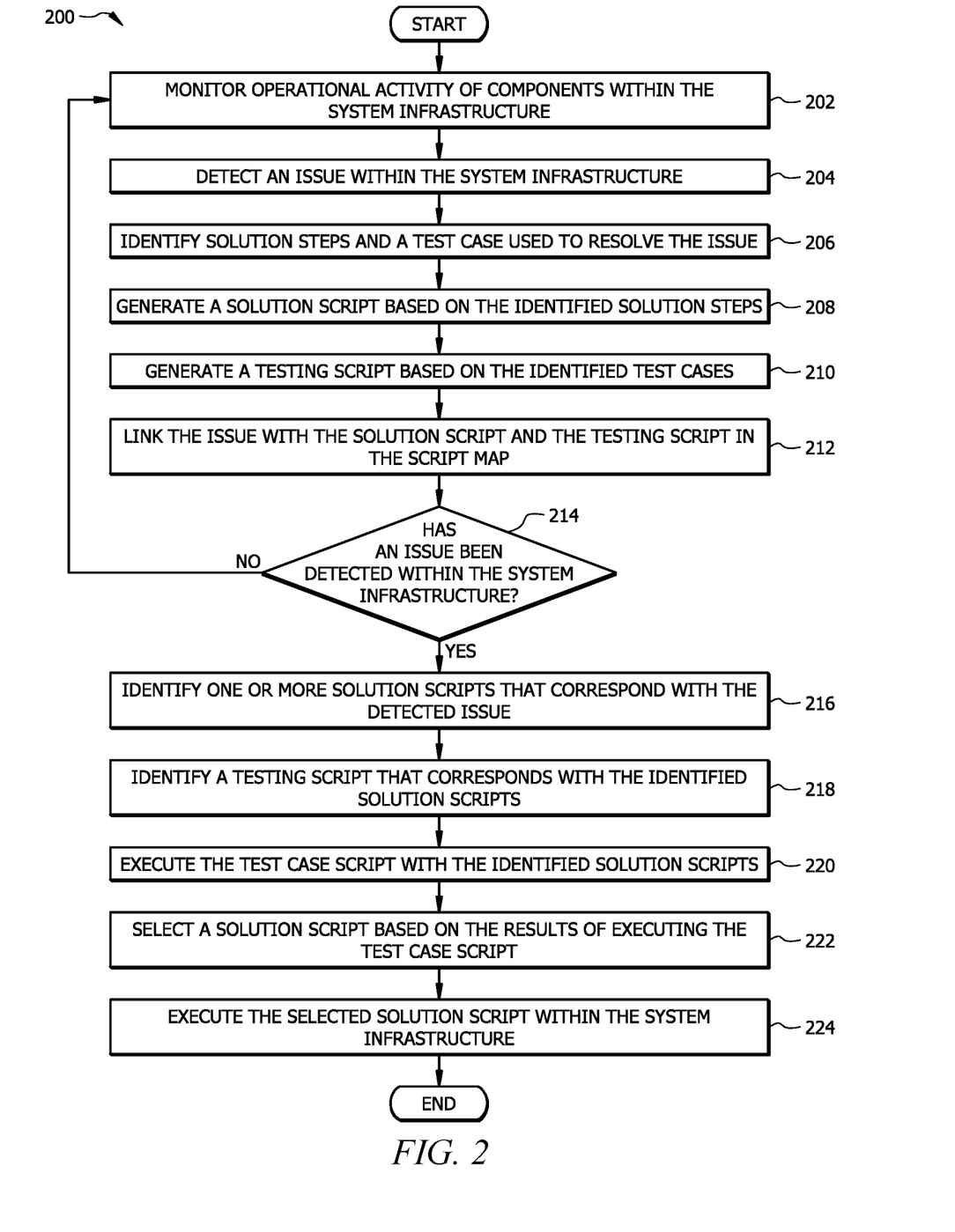
FIG. 2 is a flowchart of an embodiment of a self-healing method.

FIG. 2 is a flowchart of an embodiment of a self-healing method 200. The system healing device 102 may employ method 200 to monitor the health of the system infrastructure 104 and to autonomously resolve issues within the system infrastructure 104 over time using solution scripts 120 and testing scripts 122. The system healing device 102 may method 200 in conjunction with a DevOps toolchain to monitor the health of the system infrastructure 104 as the system components 108 within the system infrastructure 104 change over time. This process allows the system healing device 102 to detect and resolve issues as they arise within the system infrastructure 104. This process also reduces the downtime due to diagnosing and resolving issues within the system infrastructure 104.

In one embodiment, the system healing device 102 is configured to provide an interface (e.g. a graphical user interface) that allows a network operator to monitor the health of the system infrastructure 104 and to modify the system components 108 within the system infrastructure 104. A network operator may use the system healing device 102 to add new system components 108 to the system infrastructure 104, to remove system components 108 from the system infrastructure 104, or to modify a configuration for a system component 108. For instance, the system healing device 102 may allow a user to add a new system component 108, to remove a system component 108, or to modify settings of a system component 108. As an example, the system healing device 102 may receive a device configuration for a new hardware device from a user using a graphical user interface (e.g. a web portal). In this example, the system healing device 102 will use the received device configuration to configure the new system component 108 to integrate the new system component 108 with the system infrastructure 104. As another example, the system healing device 102 may receive a device configuration for reconfiguring a hardware device from a user. In this example, the system healing device 102 will use the received device configuration to reconfigure and modify the operation of the system component 108.

Learning Phase

At step 202, the monitoring engine 112 monitors the operational activity of system components 108 within the system infrastructure 104. The monitoring engine 112 is configured to periodically measure the performance of the system infrastructure 104. For example, the monitoring engine 112 may periodically collect data about the number of system components 108, the types of system components 108, the operating conditions of the system components 108, and/or data activity within the system infrastructure 104. In one embodiment, the monitoring engine 112 is configured to use API to determine the current operating conditions of the system components 108. For example, the monitoring engine 112 may periodically send API calls to request information about the current operating conditions of one or more system components 108.

At step 204, the monitoring engine 112 detects an issue within the system infrastructure 104 based on the current operating conditions of the system components 108. Here, the monitoring engine 112 detects an issue or error that is associated with one or more system components 108 within the system infrastructure 104. As an example, the monitoring engine 112 may detect an issue within the system infrastructure 104 based on a decrease in the performance of one or more system components 108 over a predetermined period of time. For instance, the monitoring engine 112 may compare differences in the operating characteristics of a system component 108 to predetermined threshold values to determine whether the system component 108 is experiencing a decrease in performance. For instance, the monitoring engine 112 may detect an increase processor usage, a decrease in available memory, a decrease in available bandwidth, a decrease in data throughput, or any other type of decrease of performance for a system component 108. As another example, the monitoring engine 112 may detect an issue within the system infrastructure 104 in response to receiving an error code from one or more of the system components 108. In some instances, the monitoring engine 112 may detect an issue after integrating the new system component 108 with the system infrastructure 104, removing a system component 108 from the system infrastructure 104, or modifying a system component 108 within the system infrastructure 104.

At step 206, the monitoring engine 112 identifies solution steps and test cases that are used to resolve the issue. As an example, the monitoring engine 112 may be configured to use a system maintenance log 118 to identify actions and test cases that a network operator uses to resolve the issue. In this case, the system maintenance log 118 may comprise a sequence of commands and instructions that are used to resolve the issue. For example, the system maintenance log 118 may comprise commands for clearing caches, clearing logs, clearing disk space, rebooting a system component 108, load balancing data among system components 108, data prioritization, modifying network settings, modifying settings of a system component 108, or any other suitable type of commands that are sent to a system component 108.

The system maintenance log 118 may also comprise settings or instructions for configuring a test environment that is used to simulate and test the solution that is used to resolve the issue. The test environment is configured to simulate the effect on the system infrastructure 104 in response to sending commands to one or more hardware components 108. For example, a network operator may build a test environment that uses synthetic data or previously stored data activity from the system infrastructure 104 for testing a solution to the detected issue. In this case, the monitoring engine 112 identifies the settings for the test environment and the commands that were sent to one or more system components 108 to simulate and test a solution for resolving the issue.

As another example, the monitoring engine 112 may be configured to monitor the operations and actions that are performed by a network operator to identify solution steps and test cases that are used to resolve the issue. For instance, the monitoring engine 112 may monitor the actions that are performed by the network operator while the network operator uses one or more DevOps tools to resolve the detected issue. In this case, the monitoring engine 112 may be configured to monitor the operational activity of the system infrastructure 104 as a network operator resolves the issue. For example, the monitoring engine 112 may use APIs to identify commands and instructions that are used by the network operator to resolve the detected issue. The monitoring engine 112 may also use APIs to identify settings or instructions for configuring and operating a test environment that is used to simulate and test a solution for resolving the issue.

At step 208, the monitoring engine 112 generates a solution script 120 based on the identified solutions steps. The solution script 120 comprises machine-executable commands for performing operations on one or more system components 108. Here, the monitoring engine 112 generates a solution script 120 by formatting or converting the identified commands that were sent to system components 108 in step 206 into machine-executable instructions or commands that can be executed by one or more system components 108. The solution script 120 captures the commands that are used, where the commands are sent, and the sequence that the commands are sent. After generating the solution script 120, the monitoring engine 112 may link the solution script 120 with an identifier 128 that uniquely identifies the solution script 120. The identifier 128 may be an alphanumeric identifier or any other suitable type of identifier.

At step 210, the monitoring engine 112 generates a testing script 122 based on the identified test cases. The testing script 122 comprises machine-executable commands for configuring a test environment and simulating one or more solution scripts 120. Here, the monitoring engine 112 generates a testing script 122 by converting the test environment settings and instructions that were identified in step 206 into machine-executable instructions or commands that can be used to configure a test environment and executable instructions or commands that can be executed by the test environment to simulate one or more solution scripts 120. After generating the testing script 122, the monitoring engine 112 may link the testing script 122 with an identifier 130 that uniquely identifies the testing script 122. The identifier 130 may be an alphanumeric identifier or any other suitable type of identifier.

At step 212, the monitoring engine 112 links the solution script 120 and the testing scripts 122 in the script map 124. Here, the monitoring engine 112 creates an entry in the script map 124 that links an issue with a solution script 120 and a testing script 122 that are associated with resolving the issue. The monitoring engine 112 may first associate the issue that was detected in step 204 with an issue identifier 126. The issue identifier 126 may be an error code or any other suitable type identifier that uniquely identifies a type of issue. For example, the issue identifier 126 may be uniquely associated with a particular system component 108 type and an error type. The monitoring engine 112 then links the issue identifier 126 with the identifier 128 for the solution script 120 and the identifier 130 for the testing script 122 that was generated in steps 208 and 210, respectively, in the script map 124.

Autonomous Self-Healing Phase

In one embodiment, the monitoring engine 112 may repeat steps 202-212 for a predetermined amount of time or a predetermined number of iterations which allows the monitoring engine 112 to build a repository of solution scripts 120 and testing scripts 122 that can be used to resolve future issues that are detected within the system infrastructure 104. Once the monitoring engine 112 has a suitable number of solution scripts 120 and testing scripts 122 entries in the script map 124, the monitoring engine 112 may begin using steps 214-224 to autonomously detect and resolve issues within the system infrastructure 104. In some embodiments, the monitoring engine 112 may continue to run steps 202-210 in parallel after enabling the ability to autonomously detect and resolve issues within the system infrastructure 104. This option allows the monitoring engine 112 to continue to build the repository of solution scripts 120 and testing scripts 122.

At step 214, the monitoring engine 112 determines whether another issue been detected within the system infrastructure 104. The monitoring engine 112 determines whether another issue has been detected using a process that is similar to the process described in steps 202 and 204. The monitoring engine 112 returns to step 202 in response to determining that another issue has not been detected within the system infrastructure 104. In this case, the monitoring engine 112 returns to step 202 to continue monitoring the operational activity of the system infrastructure 104. The monitoring engine 112 proceeds to step 216 in response to determining that an issue has been detected within the system infrastructure 104. For example, the monitoring engine 112 may detect an issue after integrating the new system component 108 with the system infrastructure 104, removing a system component 108 from the system infrastructure 104, or modifying a system component 108 within the system infrastructure 104.

At step 216, the monitoring engine 112 identifies one or more solution scripts 120 that correspond with the detected issue. When an issue is detected, the monitoring engine 112 will identify an issue identifier 126 that corresponds with the detected issue. The monitoring engine 112 uses the issue identifier 126 with the script map 124 to identify solution scripts 120 that are associated with the issue identifier 126. For example, the monitoring engine 112 may use the issue identifier 126 as a search token to identify entries in the script map 124 that are associated with the issue identifier 126.

At step 218, the monitoring engine 112 identifies a testing script 122 that corresponds with the identified solution scripts 120. Here, the monitoring engine 112 identifies a testing script 122 that is linked with the identified solution scripts 120 in the script map 124.

At step 220, the monitoring engine 112 executes the testing script 122 with the identified solution scripts 120. The monitoring engine 112 executes the identified testing script 122 by using the instructions or commands from the testing script 122 to configure a test environment and to simulate the identified solution scripts 120. In one embodiment, the monitoring engine 112 may also use previously collected system information 116 with the test environment to simulate the identified solution scripts 120. For example, the monitoring engine 112 may use information about the configurations of the system components 108 in the system infrastructure 104 to configure the test environment. As another example, the monitoring engine 112 may collect data traffic samples from the system infrastructure 104 while monitoring the operational activity within the system infrastructure 104. In this case, the monitoring engine 112 may use the collected data traffic with the test environment to simulate the identified solution scripts 120.

At step 222, the monitoring engine 112 selects a solution script 120 based on the results of executing the testing script 122. When there are more than one solution scripts 120 that are associated with the issue identifier 126, the monitoring engine 112 compares the results from executing the testing scripts 122 to identify which solution script 120 resolves the detected issue and/or provides the greatest performance increase. For example, the issue identifier 126 may be associated with two solution scripts 120. In this example, the monitoring engine 112 may simulate both solution scripts 120 and select the solution script 120 that resolves the detected issue and provides the most performance improvements.

At step 224, the monitoring engine 112 executes the selected solution script 120 within the system infrastructure 104. Here, the monitoring engine 112 executes the command and instructions provided by the selected solution script 120 to resolve the detected issue. For example, the monitoring engine 112 may send commands to one or more system components 108 to resolve the detected issue based on the selected solution script 120. As another example, the monitoring engine 112 may reconfigure one or more system components 108 based on instructions provided by the selected solution script 120. After the monitoring engine 112 executes the selected solution script 120, the monitoring engine 112 may terminate method 200 or may return to step 202 to continue monitoring for other issues within the system infrastructure 104.

System Healing Device Hardware Configuration

Figure 3:
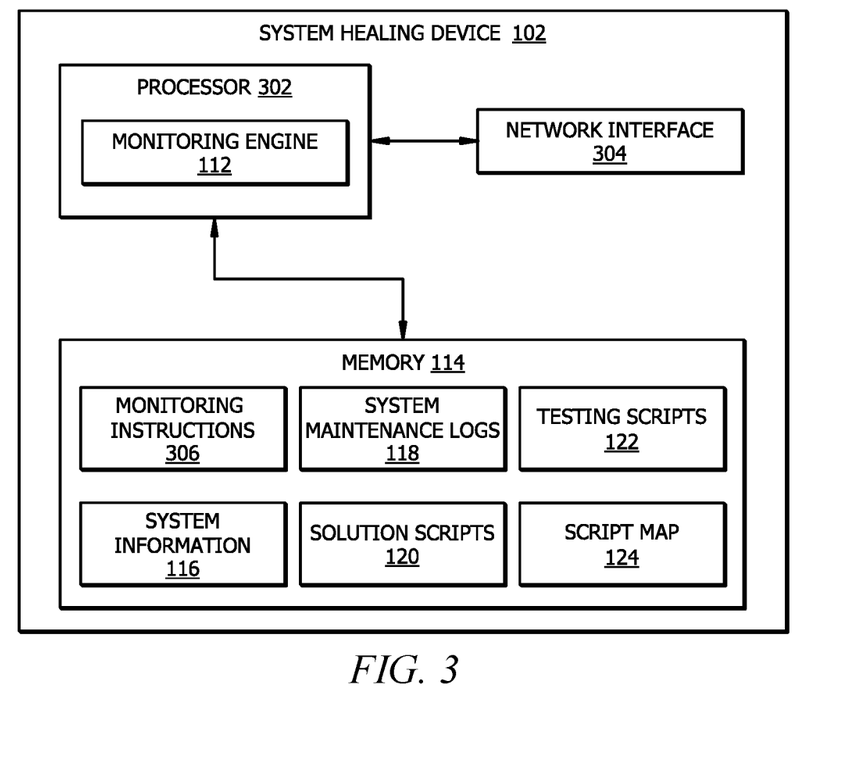
FIG. 3 is a schematic diagram of an embodiment of a device configured to implement self-healing.

FIG. 3 is a schematic diagram of an embodiment of a device (e.g. system healing device 102) configured to monitor and resolve issues associated with a system infrastructure 104. The system healing device 102 comprises a processor 302, a memory 114, and a network interface 304. The system healing device 102 may be configured as shown or in any other suitable configuration.

The processor 302 comprises one or more processors operably coupled to the memory 114. The processor 302 is any electronic circuitry including, but not limited to, state machines, one or more central processing unit (CPU) chips, logic units, cores (e.g. a multi-core processor), field-programmable gate array (FPGAs), application-specific integrated circuits (ASICs), or digital signal processors (DSPs). The processor 302 may be a programmable logic device, a microcontroller, a microprocessor, or any suitable combination of the preceding. The processor 302 is communicatively coupled to and in signal communication with the memory 114. The one or more processors are configured to process data and may be implemented in hardware or software. For example, the processor 302 may be 8-bit, 16-bit, 32-bit, 64-bit, or of any other suitable architecture. The processor 302 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components.

The one or more processors are configured to implement various instructions. For example, the one or more processors are configured to execute monitoring instructions 306 to implement a monitoring engine 112. In this way, processor 302 may be a special-purpose computer designed to implement the functions disclosed herein. In an embodiment, the monitoring engine 112 is implemented using logic units, FPGAs, ASICs, DSPs, or any other suitable hardware. The monitoring engine 112 is configured to operate as described in FIGS. 1 and 2. For example, the monitoring engine 112 may be configured to perform the steps of method 200 as described in FIG. 2.

The memory 114 comprises one or more disks, tape drives, or solid-state drives, and may be used as an over-flow data storage device, to store programs when such programs are selected for execution, and to store instructions and data that are read during program execution. The memory 114 may be volatile or non-volatile and may comprise a read-only memory (ROM), random-access memory (RAM), ternary content-addressable memory (TCAM), dynamic random-access memory (DRAM), and static random-access memory (SRAM).

The memory 114 is operable to store monitoring instructions 306, system information 116, system maintenance logs 118, solution scripts 120, testing scripts 122, script maps 124, and/or any other data or instructions. The monitoring instructions 306 may comprise any suitable set of instructions, logic, rules, or code operable to execute the monitoring engine 112. The system information 116, system maintenance logs 118, solution scripts 120, testing scripts 122, and script maps 124 are configured similar to system information 116, system maintenance logs 118, solution scripts 120, testing scripts 122, and script maps 124 described in FIGS. 1 and 2, respectively.

The network interface 304 is configured to enable wired and/or wireless communications. The network interface 304 is configured to communicate data between the system healing device 102 and other devices (e.g. system components 108), systems, or domain. For example, the network interface 304 may comprise a WIFI interface, a LAN interface, a WAN interface, a modem, a switch, or a router. The processor 302 is configured to send and receive data using the network interface 304. The network interface 304 may be configured to use any suitable type of communication protocol as would be appreciated by one of ordinary skill in the art.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated with another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

The invention claimed is:

1. A self-healing computing system, comprising:
a plurality of hardware components configured to form a computing system infrastructure; and
a system healing device in signal communication with the plurality of hardware components, comprising:
a memory operable to store:
solution scripts comprising machine executable commands for performing operations on one or more hardware components;
testing scripts comprising machine executable commands for configuring a test environment to simulate one or more solution scripts; and
a script map configured to associate an issue with a solution script and a testing script that are associated with resolving the issue, wherein the issue is associated with one or more hardware components within the computing system infrastructure; and
a processor operably coupled to the memory, configured to:
periodically send a first Application Programming Interface (API) call to request information about the operating conditions for the plurality hardware components;
detect a first issue that is associated with a hardware component from the plurality hardware components based on the operating conditions for the plurality of hardware components;
send a second API call to request information identifying one or more commands that are used by an operator to resolve the first issue;
generate a solution script based on the identified one or more commands, wherein generating the solution script comprises converting the identified one or more commands into machine executable commands for performing operations on the hardware component;
send a third API call to request information identifying settings for a test environment configuration that is used to simulate sending the one or more commands to the hardware component to resolve the first issue, wherein the test environment simulates the effect on the computing system infrastructure in response to sending the one or more commands to the hardware component;
generate a testing script based on the identified test environment configuration, wherein generating the testing script comprises converting the identified settings for the test environment configuration into executable commands for configuring a test environment and simulating the solution script; and
store an association between the first issue, the solution script, and the testing script in the script map.

2. The system of claim 1, wherein the system healing device is further configured to:
detect a second issue based on the operating conditions for the plurality of hardware components;
identify one or more solution scripts in the script map that correspond with the detected second issue;
identify a testing script in the script map that corresponds with the identified one or more solution scripts;
configure a test environment based on the identified testing script;
execute commands from the identified testing script to obtain simulation results for the one or more solution scripts;
select a solution script from among the one or more solution scripts that correspond with the detected second issue based on the simulation results; and
execute the selected solution script, wherein executing the selected solution script comprises sending commands to performing operations on one or more hardware components of the computing system infrastructure.

3. The system of claim 2, wherein:
system healing device is further configured to:
receive a device configuration for a new hardware component;
configure the new hardware component using the receive device configuration to integrate the new hardware component with the computing system infrastructure; and
detecting the second issue occurs after integrating the new hardware component with the computing system infrastructure.

4. The system of claim 2, wherein:
system healing device is further configured to:
receive a device configuration for a hardware component within the computing system infrastructure;
configure the hardware component using the receive device configuration to modify an operation of the hardware component; and
detecting the second issue occurs after modifying the operation of the hardware component.

5. The system of claim 1, wherein identifying the one or more commands that are sent to the hardware component to resolve the first issue comprises identifying commands associated with the hardware component in a system maintenance log.

6. The system of claim 1, wherein detecting the first issue comprises receiving an error code from the hardware component that is associated with the first error.

7. The system of claim 1, wherein:
system healing device is further configured to periodically measure a performance of the hardware component that is associated with the first issue; and detecting the first issue is based on a decrease in the performance of the hardware component that is associated with the first issue over a predetermined period of time.

8. A self-healing method for a computing system infrastructure, comprising:
periodically send a first Application Programming Interface (API) call to request information about the operating conditions for a plurality hardware components within a computing system infrastructure;
detecting a first issue that is associated with a hardware component from the plurality hardware components based on the operating conditions for the plurality of hardware components;
sending a second API call to request information identifying one or more commands that are used by an operator to resolve the first issue;
generating a solution script based on the identified one or more commands, wherein generating the solution script comprises converting the identified one or more commands into machine executable commands for performing operations on the hardware component;
sending a third API call to request information identifying settings for a test environment configuration that is used to simulate sending the one or more commands to the hardware component to resolve the first issue, wherein the test environment simulates the effect on the computing system infrastructure in response to sending the one or more commands to the hardware component;
generating a testing script based on the identified test environment configuration, wherein generating the testing script comprises converting the identified settings for the test environment configuration into executable commands for configuring a test environment and simulating the solution script; and
storing an association between the first issue, the solution script, and the testing script in a script map.

9. The method of claim 8, further comprising:
detecting a second issue based on the operating conditions for the plurality of hardware components;
identifying one or more solution scripts in the script map that correspond with the detected second issue;
identifying a testing script in the script map that corresponds with the identified one or more solution scripts;
configuring a test environment based on the identified testing script;
executing commands from the identified testing script to obtain simulation results for the one or more solution scripts;
selecting a solution script from among the one or more solution scripts that correspond with the detected second issue based on the simulation results; and
executing the selected solution script, wherein executing the selected solution script comprises sending commands to performing operations on one or more hardware components of the computing system infrastructure.

10. The method of claim 9, further comprising:
receiving a device configuration for a new hardware component; and
configuring the new hardware component using the receive device configuration to integrate the new hardware component with the computing system infrastructure; and
wherein detecting the second issue occurs after integrating the new hardware component with the computing system infrastructure.

11. The method of claim 9, further comprising:
receiving a device configuration for a hardware component within the computing system infrastructure;
configuring the hardware component using the receive device configuration to modify an operation of the hardware component; and
wherein detecting the second issue occurs after modifying the operation of the hardware component.

12. The method of claim 8, wherein identifying the one or more commands that are sent to the hardware component to resolve the first issue comprises identifying commands associated with the hardware component in a system maintenance log.

13. The method of claim 8, wherein detecting the first issue comprises receiving an error code from the hardware component that is associated with the first error.

14. The method of claim 8, further comprising:
periodically measuring a performance of the hardware component that is associated with the first issue; and
wherein detecting the first issue is based on a decrease in the performance of the hardware component that is associated with the first issue over a predetermined period of time.

15. A computer program comprising executable instructions stored in a non-transitory computer readable medium that when executed by a processor causes the processor to:
periodically send a first Application Programming Interface (API) call to request information about the operating conditions for a plurality hardware components within a computing system infrastructure;
detect a first issue that is associated with a hardware component from the plurality hardware components based on the operating conditions for the plurality of hardware components;
send a second API call to request information identifying one or more commands that are used by an operator to resolve the first issue;
generate a solution script based on the identified one or more commands, wherein generating the solution script comprises converting the identified one or more commands into machine executable commands for performing operations on the hardware component;
send a third API call to request information identifying settings for a test environment configuration that is used to simulate sending the one or more commands to the hardware component to resolve the first issue, wherein the test environment simulates the effect on the computing system infrastructure in response to sending the one or more commands to the hardware component;
generate a testing script based on the identified test environment configuration, wherein generating the testing script comprises converting the identified settings for the test environment configuration into executable commands for configuring a test environment and simulating the generated solution script; and
store an association between the first issue, the solution script, and the testing script in a script map.

16. The computer program of claim 15, further comprising instructions that when executed by the processor causes the processor to:
detect a second issue based on the operating conditions for the plurality of hardware components;
identify one or more solution scripts in the script map that correspond with the detected second issue;
identify a testing script in the script map that corresponds with the identified one or more solution scripts;

configure a test environment based on the identified testing script;

execute commands from the identified testing script to obtain simulation results for the one or more solution scripts;

select a solution script from among the one or more solution scripts that correspond with the detected second issue based on the simulation results; and execute the selected solution script, wherein executing the selected solution script comprises sending commands to performing operations on one or more hardware components the computing system infrastructure.

17. The computer program of claim 16, further comprising instructions that when executed by the processor causes the processor to:

receive a device configuration for a hardware component within the computing system infrastructure;

configure the hardware component using the receive device configuration to modify an operation of the hardware component; and wherein detecting the second issue occurs after modifying the operation of the hardware component.

18. The computer program of claim 15, wherein identifying the one or more commands that are sent to the hardware component to resolve the first issue comprises identifying commands associated with the hardware component in a system maintenance log.

19. The computer program of claim 15, wherein detecting the first issue comprises receiving an error code from the hardware component that is associated with the first error.

20. The computer program of claim 15, further comprising instructions that when executed by the processor causes the processor to:

periodically measure a performance of the hardware component that is associated with the first issue; and wherein detecting the first issue is based on a decrease in the performance of the hardware component that is associated with the first issue over a predetermined period of time.

* * * * *